United States Patent
Van De Westerlo

(10) Patent No.: US 6,496,069 B1
(45) Date of Patent: Dec. 17, 2002

(54) CASCODE CIRCUIT CAPABLE OF CONTRIBUTING A COMPARATIVELY LOW INTERMODULATION DISTORTION IN THE AMPLIFIED SIGNALS

(75) Inventor: Marcel Henricus Wilhemus Van De Westerlo, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/856,928

(22) PCT Filed: Sep. 25, 2000

(86) PCT No.: PCT/EP00/09406

§ 371 (c)(1),
(2), (4) Date: May 30, 2001

(87) PCT Pub. No.: WO01/26216

PCT Pub. Date: Apr. 12, 2001

(30) Foreign Application Priority Data

Oct. 1, 1999 (EP) ............................................. 99203205

(51) Int. Cl.$^7$ .............................. H03F 3/26; H03F 1/22
(52) U.S. Cl. ...................................... 330/276; 330/311
(58) Field of Search ........................... 330/98, 99, 100, 330/276, 300, 311

(56) References Cited

U.S. PATENT DOCUMENTS 4,706,038 A * 11/1987 Navidi et al. ............... 330/276
5,061,903 A * 10/1991 Vasile ......................... 330/311
5,185,582 A * 2/1993 Barbu ......................... 330/311
5,742,205 A * 4/1998 Cowen et al. ............... 330/276
6,111,465 A * 8/2000 Kakuta et al. ............... 330/276

* cited by examiner

Primary Examiner—Robert Pascal
Assistant Examiner—Khanh Van Nguyen
(74) Attorney, Agent, or Firm—Steven R. Biren

(57) ABSTRACT

An amplifier has a cascade circuit including an input circuit, a cascode circuit and an output circuit. The input circuit receives input signals via an input (10), which input signals are converted to amplified signals by the cascode circuit. These amplified signals are subsequently supplied to an output (94) by the output circuit. The cascode circuit includes two input transistors (40 and 62) and an output transistor (74). By means of three capacitors (32, 46 and 50) and a coil (48), the cascode circuit is built up in such a way that the input transistors (40 and 62) are parallel-connected for comparatively high-frequency input signals, while the input transistors (40 and 62) are series-connected for comparatively low-frequency supply signals. This results in the transconductance being doubled, while the DC collector current or drain current remains the same. By doubling the transconductance, the contribution of the cascode circuit to the intermodulation distortion in the amplified signals is reduced substantially. As the DC collector current or drain current remains unchanged, the power dissipated in the amplifier remains substantially the same.

8 Claims, 1 Drawing Sheet

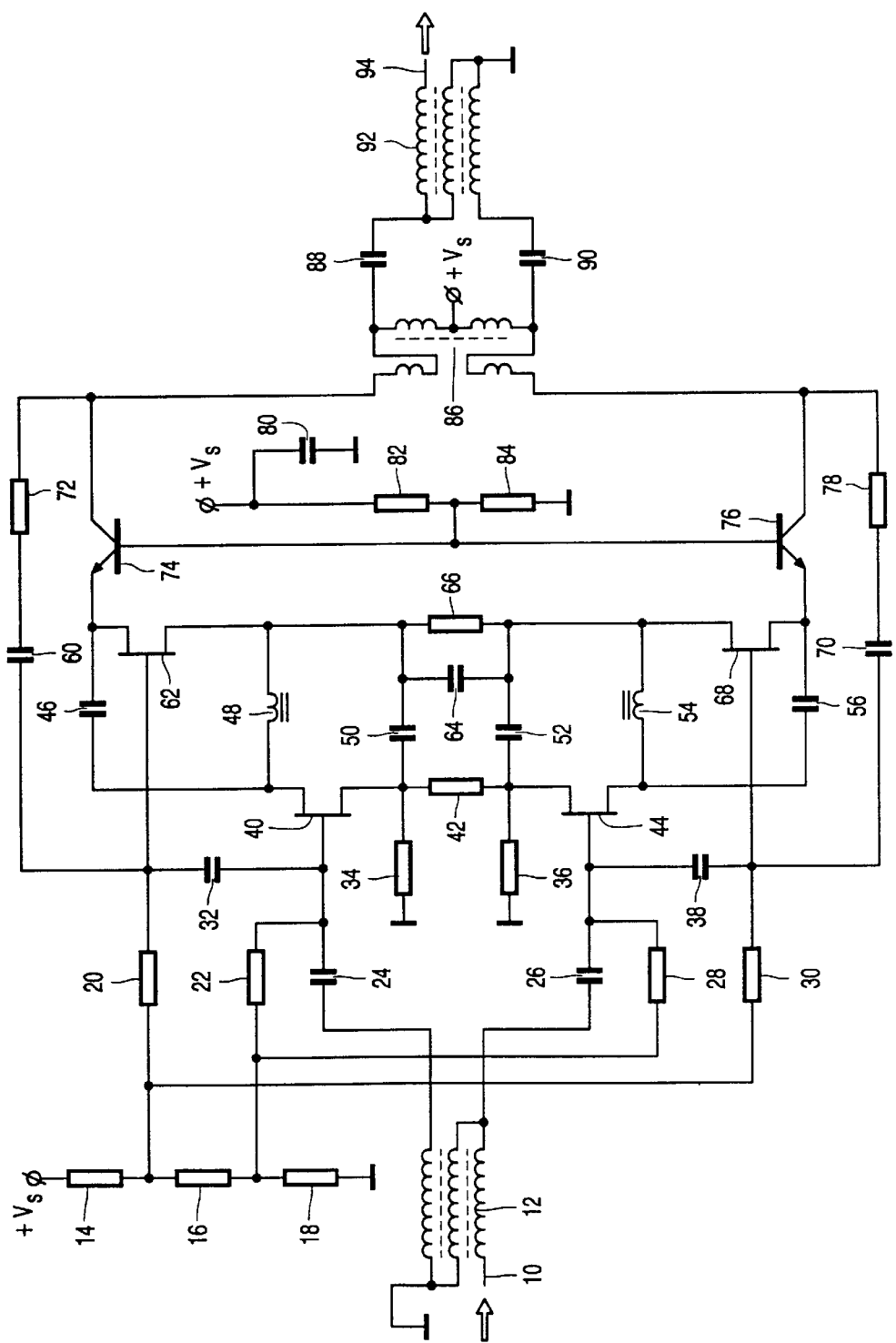

CASCODE CIRCUIT CAPABLE OF CONTRIBUTING A COMPARATIVELY LOW INTERMODULATION DISTORTION IN THE AMPLIFIED SIGNALS

FIELD OF THE INVENTION

The invention relates to an amplifier comprising a cascade circuit including an input circuit, a cascode circuit and an output circuit, the input circuit receiving input signals via an input, and the cascode circuit converting the input signals to amplified signals, the output circuit supplying the amplified signals to an output, and the cascode circuit comprising an input transistor and an output transistor.

The invention also relates to a CATV amplifier module comprising a cascade circuit including an input circuit, a cascode circuit and an output circuit, the input circuit receiving input signals via an input, and the cascode circuit converting the input signals to amplified signals, the output circuit supplying the amplified signals to an output, and the cascode circuit comprising an input transistor and an output transistor.

The invention further relates to a cascode circuit for amplifying input signals, comprising an input transistor and an output transistor.

BACKGROUND OF THE INVENTION

Such an amplifier is well-known and applied, inter alia, in the CATV amplifier module BGD902 developed by PHILIPS. Such CATV amplifier modules are employed in coaxial cable networks to maintain the signal level. For this purpose, these CATV amplifier modules comprise a cascade circuit including, respectively, an input circuit, an amplifier circuit and an output circuit. As these CATV amplifier modules must meet very high distortion requirements, the amplifier circuits are generally embodied so as to be symmetrical push-pull amplifiers. By virtue of this measure, the second-order products formed cancel each other out in the output circuit. In this respect, it is very important that both amplifier branches should be symmetrically driven and loaded. In the known CATV amplifier module, two cascode circuits, accommodated in a symmetrical push-pull configuration, are responsible for amplifying the input signals. It is to be noted that the amplifier in accordance with the invention does not necessarily comprise a plurality of cascode circuits accommodated in a symmetrical configuration. The amplifier in accordance with the invention may alternatively comprise only one cascode circuit.

The known cascode circuit is responsible for a comparatively high intermodulation distortion contribution to the amplified signals.

SUMMARY OF THE INVENTION

It is an object of the invention to provide an amplifier of the type mentioned in the opening paragraph, in which the cascode circuit's contribution to the intermodulation distortion in the amplified signals is comparatively small.

To achieve this, the amplifier in accordance with the invention is characterized in that the cascode circuit comprises a further input transistor, the input transistor and said further input transistor being parallel-connected for comparatively high-frequency input signals, and the input transistor and said further input transistor being series-connected for comparatively low-frequency supply signals. The invention is based on the recognition that the comparatively high contribution to the intermodulation distortion by the known cascode circuit is caused predominantly by the input transistor. This can be attributed to the non-linear relation between the collector current and the base-emitter voltage (for a bipolar input transistor) or between the drain current and the gate-source voltage (for a field effect input transistor). It is well known that the influence of these non-linearities can be reduced by increasing the transconductance of the input transistor.

The transconductance of a bipolar transistor can be readily increased by increasing the DC collector current $I_c$ (a supply signal). Likewise, the transconductance of a field effect transistor can be readily increased by increasing the DC drain current $I_d$ (a supply signal). However, for many amplifiers, including the above-mentioned CATV amplifier modules, this does not constitute a workable alternative because the amplifier's power dissipation is subject to strict limitations.

Providing the cascode circuit with an additional input transistor, which, for comparatively high-frequency (for example RF) input signals, is parallel-connected to the input transistor already present, and which is series-connected, for comparatively low-frequency (for example DC) supply signals, to said input transistor already present, results in the transconductance being doubled, while the DC collector current or the drain current remain the same. By doubling the transconductance, the contribution of the cascode circuit to the intermodulation distortion in the amplified signals is reduced substantially. As the DC collector current or drain current remains unchanged, the power dissipated in the amplifier remains substantially the same.

It is to be noted that United States patent specification U.S. Pat. No. 4,590,436 discloses an amplifier circuit wherein two transistors are parallel-connected for AC input signals and said transistors are series-connected for DC input signals. As a result of the DC series-connection of the transistors, only half the supply voltage is applied across the two transistors. By virtue thereof, the supply voltage is not limited to a value equal to half the breakdown voltage of the individual transistors. The use of a higher supply voltage will lead, however, to a higher power dissipation in this known amplifier. A further difference between this known amplifier and the amplifier in accordance with the invention resides in that the known amplifier does not comprise a cascode circuit. Besides, in said United States patent specification no mention is made of influences of the known amplifier on the intermodulation distortion contribution in the amplified signals.

An embodiment of the amplifier in accordance with the invention is characterized in that the input transistor receives the input signals on a control electrode, and the output transistor supplies the amplified signals on a first main electrode, a second main electrode of the output transistor being connected to a first main electrode of the input transistor, and the control electrode being connected via a first capacitor to a further control electrode of the further input transistor, and the first main electrode of the input transistor being connected via a second capacitor to a further first main electrode of the further input transistor, a second main electrode of the input transistor being connected via a third capacitor to a further second main electrode of the further input transistor, and the second main electrode of the input transistor being connected via a coil to the further first main electrode of the further input transistor. By virtue of the fact that all corresponding electrodes of the input transistors are connected to each other via capacitors, it is achieved in a simple way that the input transistors for comparatively high-frequency input signals are parallel-connected. In addition, the coil, which is preferably embodied so as to be a choke coil having a core of a soft-magnetic material (for example ferrite), ensures that the input transistors for comparatively low-frequency supply signals are series-connected.

BRIEF DESCRIPTION OF THE DRAWINGS

These and other aspects of the invention will be explained in greater detail by means of a drawing showing an electrical circuit diagram of an embodiment of the amplifier in accordance with the invention.

DESCRIPTION OF THE PREFERRED EMBODIMENT

The drawing shows an electrical circuit diagram of an exemplary embodiment of an amplifier in accordance with the invention. Such an amplifier can be used in, inter alia, CATV networks to maintain the signal level. An example of such an amplifier, which is known already, is the CATV amplifier module BGD902 developed by Philips. The amplifier comprises a cascade circuit including, respectively, an input circuit, two cascode circuits and an output circuit. In this exemplary embodiment, the input circuit comprises an input 10, an input transformer 12 and two capacitors 24 and 26. The cascode circuits are accommodated in a symmetrical push-pull configuration. The first cascode circuit comprises two input transistors 40 and 62, an output transistor 74, three capacitors 32, 46 and 50, and a choke coil 48. The second cascode circuit comprises two input transistors 44 and 68, an output transistor 76, three capacitors 38, 56 and 52, and a choke coil 54. The output circuit comprises an impedance transformer 86, two capacitors 88 and 90, an output transformer 92 and an output 94.

Via the input 10, the input circuit can receive wideband (for example between 40 and 900 MHz) input signals. The input circuit is provided with an input transistor 12 in the form of a transmission line transformer, which converts the asymmetric input signals to pairwise-symmetric signals. These symmetric signals are converted in the cascode circuits to amplified symmetric signals. Since CATV amplifier modules must meet very high requirements regarding distortion, these amplifier modules are generally embodied so as to be symmetrical push-pull amplifiers. As a result of the use of a symmetrical push-pull amplifier, the second-order products formed cancel each other out in the output circuit. In this respect, it is very important that both amplifier branches should be symmetrically driven and loaded. This also applies to the third-order distortion because it must be precluded that the two amplifier branches are not equally responsible for the output power. Finally, the amplified symmetric signals are supplied to an output 94 by the output circuit.

The outputs of the input transformer 12 are connected via the capacitors 24 and 26 to the cascode circuits. These capacitors 24 and 26 are responsible for DC decoupling the control electrodes from the further input transistors 40 and 44.

The first cascode circuit comprises the input transistor 62, the further input transistor 40 and the bipolar output transistor 74. The input transistors shown in the drawing are field effect transistors, for example GaAs MESFETs, but they may alternatively be embodied so as to be bipolar transistors. Via the capacitor 24 and a first capacitor 32, the first cascode circuit receives one of the symmetric input signals on a control electrode or gate of the input transistor 62. The same symmetric input signals is received by the first cascode circuit on a further control electrode or gate of the further input transistor 40. The signals amplified by the first cascode circuit are supplied on a first main electrode or collector by the output transistor 74. A second main electrode or emitter of the output transistor 74 is connected to a first main electrode or drain of the input transistor 62. The gates of the input transistors 40 and 62 are connected to each other via the first capacitor 32. The drain of the input transistor 62 is connected via a second capacitor 46 to a further first main electrode or drain of the further input transistor 40. A second main electrode or source of the input transistor 62 is connected via a third capacitor 50 to a further second main electrode or source of the further input transistor 40. The source of the input transistor 62 is connected via a coil 48 to the drain of the further input transistor 40.

The amplification and the impedance behavior of the first cascode circuit are determined by the feedback from the collector of the output transistor to the gate of the input transistor 62 via the resistor 72 and the capacitor 60, jointly with the resistors 66, 42, 34 and 36 and the capacitor 64.

By means of the capacitors 32, 46 and 50, the input transistors 40 and 62 are parallel-connected for input signals of a comparatively high frequency, such as RF signals. Conversely, for signals of a comparatively low frequency, such as DC supply signals, the input transistors 40 and 62 are series-connected via the coil 48. By providing the cascode circuit with an additional input transistor 40 in the manner described, the transconductance is doubled while the DC drain current remains the same. Said doubling of the transconductance causes the contribution of the cascode circuit to the intermodulation distortion in the amplified signals to be substantially reduced. As the DC drain current remains the same, the power dissipated in the amplifier remains substantially constant.

The construction and operation of the second cascode circuit is analogous to the construction and operation of the first cascode circuit.

By means of the resistors 14, 16, 18, 20, 22, 28 and 30, a suitable potential is derived from the supply voltage $V_s$ and supplied to the gates of the input transistors 40, 44, 62 and 68. The resistors 82 and 84 jointly form a voltage divider. The branching point of this voltage divider is connected to the base of the output transistors 74 and 76. In this manner, the potential of the base of the output transistors 74 and 76 is determined by the resistors 82, 84 and the supply voltage $V_s$. Capacitor 80 is responsible for decoupling the supply voltage $V_s$.

As regards the output circuit, it is observed that the impedance transformer 86 and the output transformer 92 are cascade-connected via the capacitors 88 and 90. The impedance transformer 86 may be embodied, for example, so as to be an autotransformer. The impedance transformer 86 ensures that a desirable impedance transformation between the cascode circuits and the output 94 of the amplifier is obtained, thus enabling an optimum power transfer to be achieved. The output transformer 92 ensures that the symmetric signals amplified by the cascode circuits are adapted to the asymmetric output 94. The capacitors 88 and 90 ensure that any DC components in the amplified signals are not allowed to pass to the output 94.

The scope of protection of the invention is not limited to the exemplary embodiments described herein. The invention is embodied in each novel characteristic and each combination of characteristics. Reference numerals in the claims do not limit the scope of protection thereof. The use of the term "comprising" does not exclude the presence of ele-

What is claimed is:

1. An amplifier comprising a cascade circuit including an input circuit, a cascode circuit and an output circuit, the input circuit receiving input signals via an input (10), and the cascode circuit converting the input signals to amplified signals, the output circuit supplying the amplified signals to an output (94), and the cascode circuit comprising an input transistor (62) and an output transistor (74), characterized in that the cascode circuit comprises a further input transistor (40), the input transistor (62) and said further input transistor (40) being parallel-connected for comparatively high-frequency input signals, and the input transistor (62) and said further input transistor (40) being series-connected for comparatively low-frequency supply signals.

2. An amplifier as claimed in claim 1, characterized in that the input transistor (62) receives the input signals on a control electrode, and the output transistor (74) supplies the amplified signals on a first main electrode, a second main electrode of the output transistor (74) being connected to a first main electrode of the input transistor(62), and the control electrode being connected via a first capacitor (32) to a further control electrode of the further input transistor (40), and the first main electrode of the input transistor (62) being connected via a second capacitor (46) to a further first main electrode of the further input transistor (40), a second main electrode of the input transistor (62) being connected via a third capacitor (50) to a further second main electrode of the further input transistor (40), and the second main electrode of the input transistor (62) being connected via a coil (48) to the further first main electrode of the further input transistor (40).

3. An amplifier as claimed in claim 1, characterized in that the amplifier is provided with a further cascode circuit, the cascode circuit and said further cascode circuit being accommodated in a symmetrical push-pull configuration.

4. A CATV amplifier module comprising a cascade circuit including an input circuit, a cascode circuit and an output circuit, the input circuit receiving input signals via an input (10), and the cascode circuit converting the input signals to amplified signals, the output circuit supplying the amplified signals to an output (94), and the cascode circuit comprising an input transistor (62) and an output transistor (74), characterized in that the cascode circuit comprises a further input transistor (40), the input transistor (62) and said further input transistor (40) being parallel-connected for comparatively high-frequency input signals, and the input transistor (62) and said further input transistor (40) being series-connected for comparatively low-frequency supply signals.

5. A CATV amplifier module as claimed in claim 4, characterized in that the input transistor (62) receives the input signals on a control electrode, and the output transistor (74) supplies the amplified signals on a first main electrode, a second main electrode of the output transistor (74) being connected to a first main electrode of the input transistor (62), and the control electrode being connected via a first capacitor (32) to a further control electrode of the further input transistor (40), and the first main electrode of the input transistor (62) being connected via a second capacitor (46) to a further first main electrode of the further input transistor (40), a second main electrode of the input transistor (62) being connected via a third capacitor (50) to a further second main electrode of the further input transistor (40), and the second main electrode of the input transistor (62) being connected via a coil (48) to the further first main electrode of the further input transistor (40).

6. A CATV amplifier module as claimed in claim 4, characterized in that the amplifier is provided with a further cascode circuit, the cascode circuit and said further cascode circuit being accommodated in a symmetrical push-pull configuration.

7. A cascode circuit for amplifying input signals, comprising an input transistor (62) and an output transistor (74), characterized in that the cascode circuit comprises a further input transistor (40), the input transistor (62) and said further input transistor (40) being parallel-connected for comparatively high-frequency input signals, and the input transistor (62) and said further input transistor (40) being series-connected for comparatively low-frequency supply signals.

8. A cascode circuit as claimed in claim 7, characterized in that the input transistor (62) receives the input signals on a control electrode, and the output transistor (74) supplies the amplified signals on a first main electrode, the first main electrode of the output transistor (74) being connected to a first main electrode of the input transistor(62), and the control electrode being connected via a first capacitor (32) to a further control electrode of the further input transistor (40), and a first main electrode of the input transistor (62) being connected via a second capacitor (46) to a further first main electrode of the further input transistor (40), a second main electrode of the input transistor (62) being connected via a third capacitor (50) to a further second main electrode of the further input transistor (40), and the first main electrode of the input transistor (62) being connected via a coil (48) to the further second main electrode of the further input transistor (40).

* * * * *